(12) United States Patent
Xu et al.

(10) Patent No.: US 11,417,703 B2
(45) Date of Patent: Aug. 16, 2022

(54) DOUBLE COLOR MICRO LED DISPLAY PANEL

(71) Applicant: HONG KONG BEIDA JADE BIRD DISPLAY LIMITED, Hong Kong (HK)

(72) Inventors: Quchao Xu, Hong Kong (HK); Qiming Li, Hong Kong (HK)

(73) Assignee: Hong Kong Beida Jade Bird Display Limited, Hong Kong (CN)

( * ) Notice: Subject to any disclaimer, the term of this patent is extended or adjusted under 35 U.S.C. 154(b) by 12 days.

(21) Appl. No.: 17/007,448

(22) Filed: Aug. 31, 2020

(65) Prior Publication Data

US 2022/0068995 A1   Mar. 3, 2022

(51) Int. Cl.
*H01L 27/15* (2006.01)
*H01L 33/62* (2010.01)
*H01L 33/46* (2010.01)

(52) U.S. Cl.
CPC .......... *H01L 27/156* (2013.01); *H01L 33/46* (2013.01); *H01L 33/62* (2013.01)

(58) Field of Classification Search
None
See application file for complete search history.

(56) References Cited

U.S. PATENT DOCUMENTS

2021/0126043 A1\*   4/2021   Lee ................. H01L 33/387

\* cited by examiner

*Primary Examiner* — Robert K Carpenter
(74) *Attorney, Agent, or Firm* — Rosenberg, Klein & Lee (57) ABSTRACT

The present invention discloses a double color micro LED display panel including a plurality of pixels and a plurality of barrier components. Each of the pixels includes a substrate, a first metal layer disposed on the substrate, a first light emitting layer disposed on the first metal layer and emitting a first light, a second metal layer disposed on the first light emitting layer and a second light emitting layer disposed on the second metal layer and emitting a second light. The wavelength of the second light is different from that of the first light. The barrier components respectively located between the pixels for blocking a light emitted from one of the pixels to the other of the pixels.

19 Claims, 9 Drawing Sheets

DOUBLE COLOR MICRO LED DISPLAY PANEL

BACKGROUND OF THE INVENTION

1. Field of the Invention

The present invention relates to a micro LED display panel, and more particularly, to a double color micro LED display panel for increasing the light output rate and resolution.

2. Description of the Prior Art

In recent years, Mini LED and Micro LED technologies have been well developed, and LED panels are commonly applied to consumer devices and applications such as augmented reality (AR), projection, heads up display (HUD), and mobile device displays, wearable device displays, and automotive displays. With the improvement of people's quality of life, the devices and applications require LED panels with improved resolution and brightness. For example, an AR display integrated within a goggle and positioned close to a wearer's eyes can have a dimension of the fingernail while still demanding an HD definition (1280× 720 pixels) or higher.

With the requirement for miniaturization and portability of electronic devices, the size of the LED panels is also limited. It means that the size of each pixel of the LED panel is decreased when the LED panel has high resolution. When the size of the pixel is smaller, the light output area of the pixel is also decreased. Moreover, light is emitted in multiple directions, so the pixel can only emit part of the light, thereby reducing the light output rate. Furthermore, the distance among the pixels is also decreased when the LED panel has high resolution. That is to say, the light emitted from one pixel is easier to transmit to another pixel of the LED panel to cause the light crosstalk, thereby decreasing the display efficiency.

In addition, it is increasingly important for a light emitting device to integrate a plurality of various types of light emitting transistors and multi-color light emitting pixel units. In the prior art, the multi-color light emitting pixel includes a plurality of light emitting regions for emitting different types of lights respectively. Because the aligning processes and transferring processes are complex, the conventional process of fabricating the different types of light emitting regions becomes increasingly difficult, thereby leading to problems such as decreased alignment accuracy, decreased yield, and increased cost.

Generally speaking, at least red, green and blue colors are superimposed to reproduce a broad array of colors. In some instances, the pixel includes three monochromatic LEDs emitting red, green and blue colors respectively, and the monochromatic LEDs are fabricated at different non-overlapping zones in the pixel. The existing technology faces the challenges to improve the effective emitting area within each pixel when the distance between the adjacent LEDs is determined. On the other hand, when a single LED emitting area is determined, further improving the overall resolution of the LED panel can be a difficult task because LEDs with different colors have to occupy their designated zones within the single pixel.

Thus, it is necessary to provide an LED structure for display panels to solve the above-mentioned drawbacks.

SUMMARY OF THE INVENTION

Therefore, the present invention is to provide a double color micro LED display panel including a plurality of pixels and a plurality of barrier components. Each of plurality of pixels includes a substrate, a first metal layer, a first light emitting layer, a second metal layer and a second light emitting layer. The first metal layer is disposed on the substrate. The first light emitting layer is disposed on the first metal layer and emits a first light. The second metal layer is disposed on the first light emitting layer. The second light emitting layer is disposed on the second metal layer and emits a second light. The wavelength of the second light is different from that of the first light. The plurality of barrier components are respectively located between the pixels for blocking a light emitted from one of the pixels to the other of the pixels.

Wherein, each of the pixels includes an insulation layer. The insulation layer covers the side wall of the first metal layer, the first light emitting layer, the second metal layer, the second light emitting layer, and the surface of the substrate. A portion of the second light emitting layer is exposed, and the insulation layer extends to the position between the pixels.

Wherein, each of the pixels includes a top conductive layer configured on the insulation layer and electrically connected to the exposed portion of the second light emitting layer. The top conductive layer extends to the position between the pixels, and the barrier component is disposed on the top conductive layer.

Wherein, the double color micro LED display panel further includes a plurality of conductive pads respectively disposed on the top conductive layer and located between the pixels, and the barrier component covers the conductive pad.

Wherein, the insulation layer further covers the barrier component.

Wherein, each of the pixels comprises a top conductive layer configured on the insulation layer. The top conductive layer extends to the position between the pixels, and the top conductive layer is separated from the barrier component by the insulation layer.

Wherein, the double color micro LED display panel further includes a plurality of conductive pads respectively disposed on the top conductive layer and located between the pixels and located above the barrier component.

Wherein, the barrier component has a reflective structure to reflect the first light emitted from the first light emitting layer to a certain direction.

Wherein, the barrier component has an optical isolation structure to baffle the first light emitted from the first light emitting layer.

Wherein, the positions of one side of the first light emitting layer and the second light emitting layer are corresponding to the barrier component. The barrier component blocks the first light emitted from the first light emitting layer and the second light emitted from the second light emitting layer.

Wherein, the area of the first light emitting layer is larger than that of the second metal layer, and the area of the second metal layer is larger than that of the second light emitting layer.

Wherein, the cross-sectional area of the first metal layer, the first light emitting layer, the second metal layer, and the second light emitting layer decreases from the bottom layer to the top layer.

Wherein, each of the pixels includes an anode pad electrically connected to the first metal layer and the second metal layer, and a cathode pad electrically connected to the top conductive layer.

Wherein, the double color micro LED display panel further includes a plurality of pixel drivers respectively configured on the substrate of the pixels. The first light emitting layer and the second light emitting layer are electrically connected to the pixel driver, and the pixel driver drives the first light emitting layer and the second light emitting layer to emit the first light and the second light respectively.

Wherein, each of the pixels includes a conductive pad configured on the substrate, and the first metal layer and the second metal layer are electrically connected with the conductive pad of the substrate.

Wherein, each of the pixels comprises a connecting structure electrically connecting to the second metal layer and the conductive pad of the substrate.

Furthermore, the shape of the connecting structure is stair shape.

Wherein, each of the pixels comprises a first reflective layer configured between the first metal and the first light emitting layer, and a second reflective layer configured between the second metal layer and the second light emitting layer.

Wherein, the first light and the second light are selected from two of red, blue, yellow, green, orange, cyan and purple lights.

In summary, the double color micro LED display panel of the present invention can effectively block the light emitted from one pixel to another of pixels by the barrier component. The barrier component can be a reflective structure to increase the light output rate, which improves the display efficiency. The barrier component also can be an optical isolation structure to increase the resolution. Moreover, the pixel also can increase the light output rate by the reflective layer configured between the metal layer and the light emitting layer.

DETAILED DESCRIPTION OF THE INVENTION

A detailed description of the hereinafter described embodiments of the disclosed apparatus and method are presented herein by way of exemplification and not limitation with reference to the Figures. Although certain embodiments are shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of embodiments of the present invention.

Figure 1:
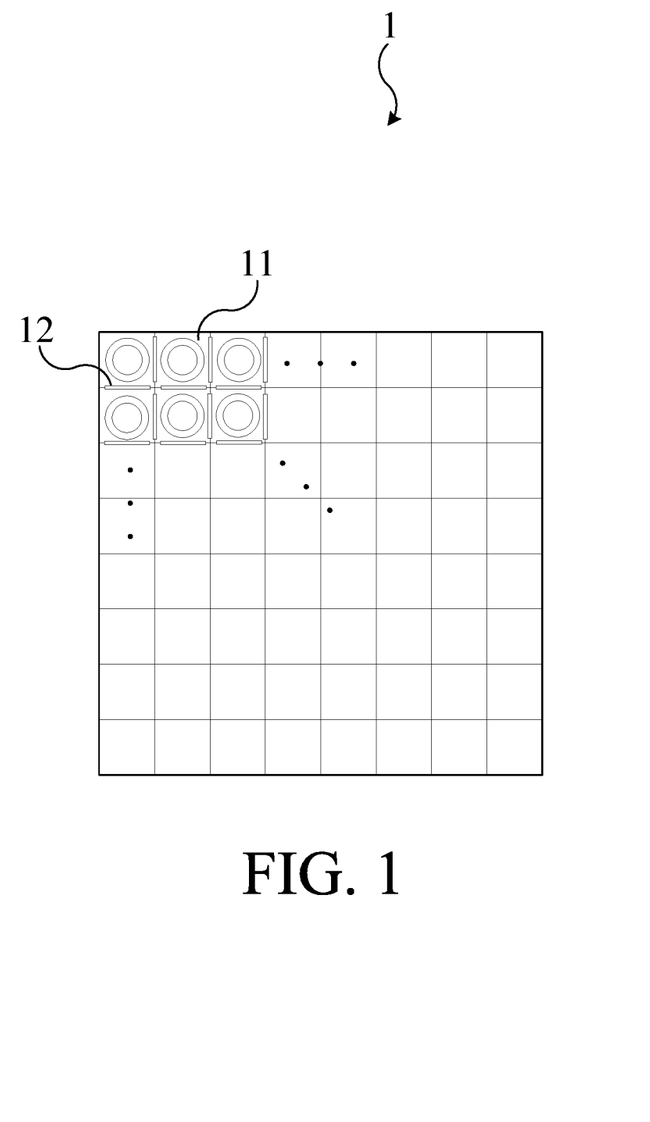
FIG. 1 is a schematic diagram illustrating a double color micro LED display panel according to an embodiment of the present invention.
Figure 2:
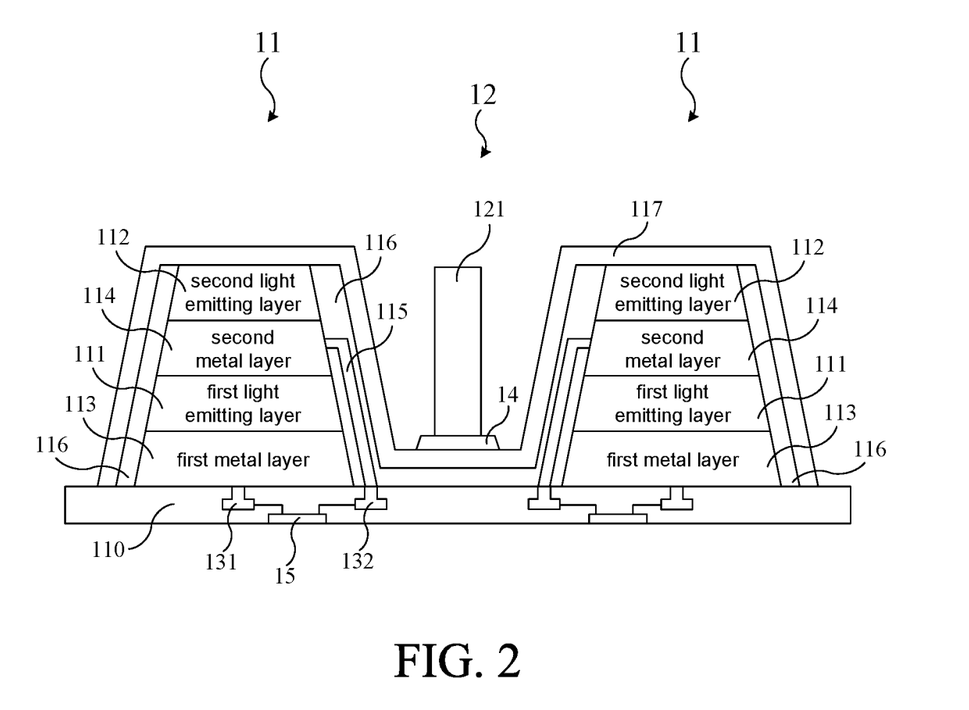
FIG. 2 is a cross-sectional diagram illustrating the two pixels of the double color micro LED display panel in FIG. 1.

Please refer to FIG. 1 and FIG. 2. FIG. 1 is a schematic diagram illustrating a double color micro LED display panel 1 according to an embodiment of the present invention. FIG. 2 is a cross-sectional diagram illustrating the two pixels 11 of the double color micro LED display panel 1 in FIG. 1. As shown in FIG. 1 and FIG. 2, the double color micro LED display panel 1 includes a plurality of pixels 11 and a plurality of barrier component 12. Each of barrier components 12 respectively located between two pixels 11. In this embodiment, the pixel 11 includes a substrate 110, a first metal layer 113, a first light emitting layer 111, a second metal layer 114, and a second light emitting layer 112. The first metal layer 113 is disposed on the substrate 110. The first light emitting layer 111 is disposed on the first metal layer 113. The second metal layer 114 is disposed on the first light emitting layer 111. The second light emitting layer 112 is disposed on the second metal layer 114. The first light emitting layer 111 emits a first light, and the second light emitting layer 112 emits a second light. The wavelength of the second light is different from that of the first light. The barrier component 12 is configured to block the light emitted from one of the pixels to another of the pixels.

In practice, the double color micro LED display panel 1 can be applied to the screens of display devices. The plurality of pixels 11 of the double color micro LED display panel 1 can be arranged in an array. The substrate 110 can be, but not limited to, a Si substrate, and the substrate 110 also can be a sapphire substrate, or a transparent substrate such as a glass substrate. The material of the substrate 110 also may be selected from one of InP, SiC and ZnO. The material of the first light emitting layer 111 and the second light emitting layer 112 can be GaN, GaP, GaAs, but it is not limited herein. The first light emitting layer 111 and the second light emitting layer 112 also can be at least one of a light emitting diode (LED), a Schottky LED, and so on. The first light emitted from the first light emitting layer 111 and the second light emitted from the second light emitting layer 112 can be selected from a range of different colors from a wavelength of 380 nm to 700 nm in visible color range. For example, the first light and the second light can be selected from two of red, blue, yellow, green, orange, cyan and purple lights. Moreover, the first light and the second light also can be selected from invisible ranges such as ultraviolet and infrared. The first metal layer 113 and the second metal layer 114 include conductive material and configured to connect with electrodes.

In practice, the first metal layer 113, the first light emitting layer 111, the second metal layer 114 and the second light emitting layer 112 are sequentially stacked on the substrate 110. For convenience, "top" means away from the substrate 110, "bottom" means toward the substrate 110, and the directional terms such as up, down, above, below, under etc.

are interpreted accordingly. That is to say, the first metal layer 113 is the bottom layer and the second light emitting layer 112 is the top layer of the pixel 11, the first light emitting layer 111 is stacked on the first metal layer 113, and the second metal layer 114 is stacked on the first light emitting layer 111. In this embodiment, the cross-sectional area of the first metal layer 113, the first light emitting layer 111, the second metal layer 114, and the second light emitting layer 112 decreases from the bottom layer to the top layer. In practice, the configuration of those layers of the pixel 11 will improve the electronic connections between the individual LED structures and the electrodes, which simplifies the fabrication process. For example, the lower layer is exposed from the upper layer for easy connection. The first metal layer 113, the first light emitting layer 111, the second metal layer 114 and the second light emitting layer 112 can be formed on the substrate 110 by chemical vapor deposition (CVD) or vapor phase epitaxy (VPE). It should be noted that "layer" described herein is not limited to a single layer but may include a plurality of sub layers. In some embodiments, a "structure" can take the form of a "layer".

In one embodiment, the pixel only includes the substrate, the first light emitting layer, and the second light emitting layer. The first light emitting layer is configured on the substrate, and the second light emitting layer is configured on the first light emitting layer. Furthermore, the first light emitting layer includes a first P type semiconductor layer and a first N type semiconductor conductive layer, and the second light emitting layer includes a second P type semiconductor layer and a second N type semiconductor layer. In practice, the first P type semiconductor layer can contact the second P type semiconductor layer, and the materials of the first P type semiconductor layer and the second P type semiconductor layer are the same. That is to say, the first light emitting layer and the second light emitting layer share the same P type semiconductor layer. In one embodiment, the positions of the P type semiconductor layer and the N type semiconductor layer of the first light emitting layer and the second light emitting layer can be exchanged, and the first light emitting layer and the second light emitting layer share the same N type semiconductor layer.

In this embodiment, the pixel 11 further includes an insulation layer 116. The insulation layer 116 covers the side wall of the first metal layer 113, the first light emitting layer 111, the second metal layer 114 and the second light emitting layer 112. Moreover, the insulation layer 116 also covers the surface of the substrate 110 and extends to the position between the pixels. In practice, the material of the insulation layer 116 can be dielectric thin-film materials such as SiNx and SiO2, or polymeric material such as polyamide (PA). Furthermore, the insulation layer 116 may be transparent. The insulation layer 116 can be formed on the pixel 11 by pasting, coating or CVD. Therefore, the insulation layer 116 prevents the first metal layer 113, the first light emitting layer 111, the second metal layer 114 and the second light emitting layer 112 from causing a short circuit.

In this embodiment, the pixel 11 further includes a top conductive layer 117. The top conductive layer 117 is configured on the insulation layer, and extends to the position between the pixels. In practice, the material of the top conductive layer 117 can be Indium Tin Oxide (ITO), and the top conductive layer 117 can be formed on the insulation layer 116 commonly by vapor deposition. Furthermore, the top conductive layer 117 may be transparent. The top conductive layer 117 is configured to maintain a good conductivity for electrode connection. In this embodiment, the insulation layer 116 only covers the side wall of the second light emitting layer 112, and the top side of the second light emitting layer 112 is exposed. Therefore, when the top conductive layer 117 is disposed on the pixel, the top conductive layer 117 contacts and electrically connects to the top side of the second light emitting layer 112. Furthermore, the top conductive layer 117 can connect the top side of the second light emitting layer 112 of all pixels in series.

Figure 3:
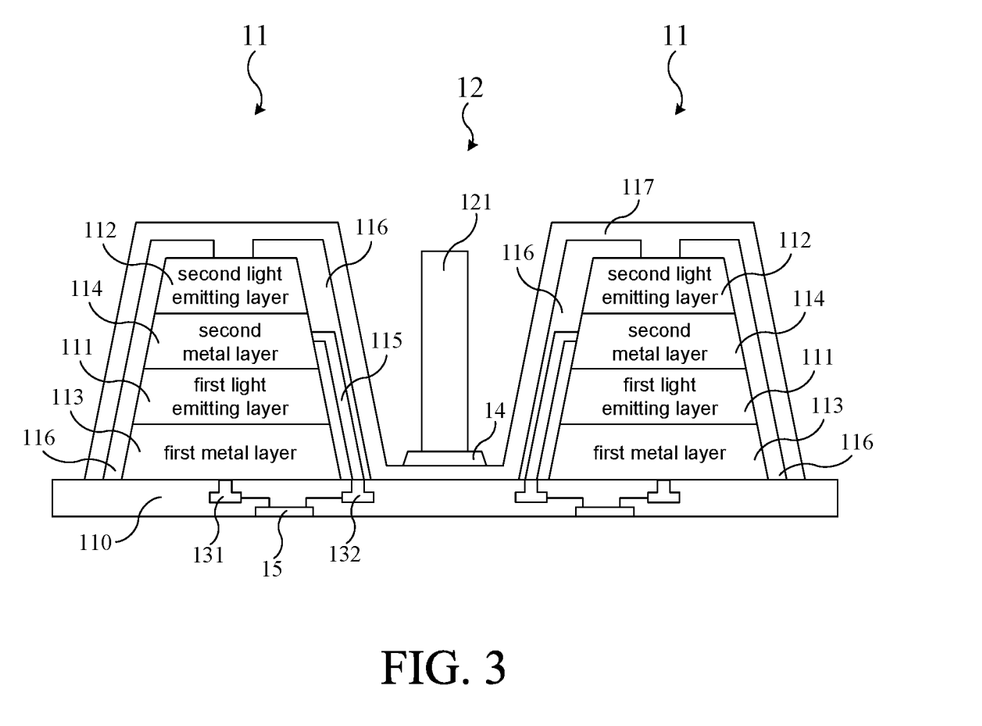
FIG. 3 is a cross-sectional diagram illustrating the two pixels of the double color micro LED display panel according to another embodiment of the present invention.

The configuration of the insulation layer 116 and the top conductive layer 117 also can be another form. Please refer to FIG. 3. FIG. 3 is a cross-sectional diagram illustrating the two pixels 11 of the double color micro LED display panel 1 according to another embodiment of the present invention. As shown in FIG. 3, the insulation layer 116 not only covers the side wall of the second light emitting layer 112, but also covers a portion of the top side of the second light emitting layer 112. That is to say, the portion of the second light emitting layer 112 which not covered by the insulation layer 116 is exposed. Moreover, the insulation layer 116 not covers the position between the pixels 11. The top conductive layer 117 is disposed on the insulation layer 116 and electrically connects to the uncovered portion of the second light emitting layer 112. Furthermore, the top conductive layer 117 extends to the position between the pixels 11. In this embodiment, the insulation layers 116 are disposed on the pixels 11 respectively, and the insulating effect can also be achieved. Similarly, the top conductive layer 117 can connect all pixels in series by connecting the uncovered portion of the second light emitting layer 112 and the position between the pixels 11.

Please refer to FIG. 2. The barrier component 12 is located on the top conductive layer 117. In this embodiment, the positions of side of the first light emitting layer 111 and the second light emitting layer 112 are corresponding to the barrier component 12. In practice, because the insulation layer 116 and the top conductive layer 117 are transparent, the first light emitted from the first light emitting layer 111 and the second light emitted from the second light emitting layer 112 can pass through the insulation layer 116 and the top conductive layer 117. Therefore, the barrier component 12 can block the first light and the second light emitted from the side of the first light emitting layer 111 and the second light emitting layer 112 to another of pixels 11.

Figure 4:
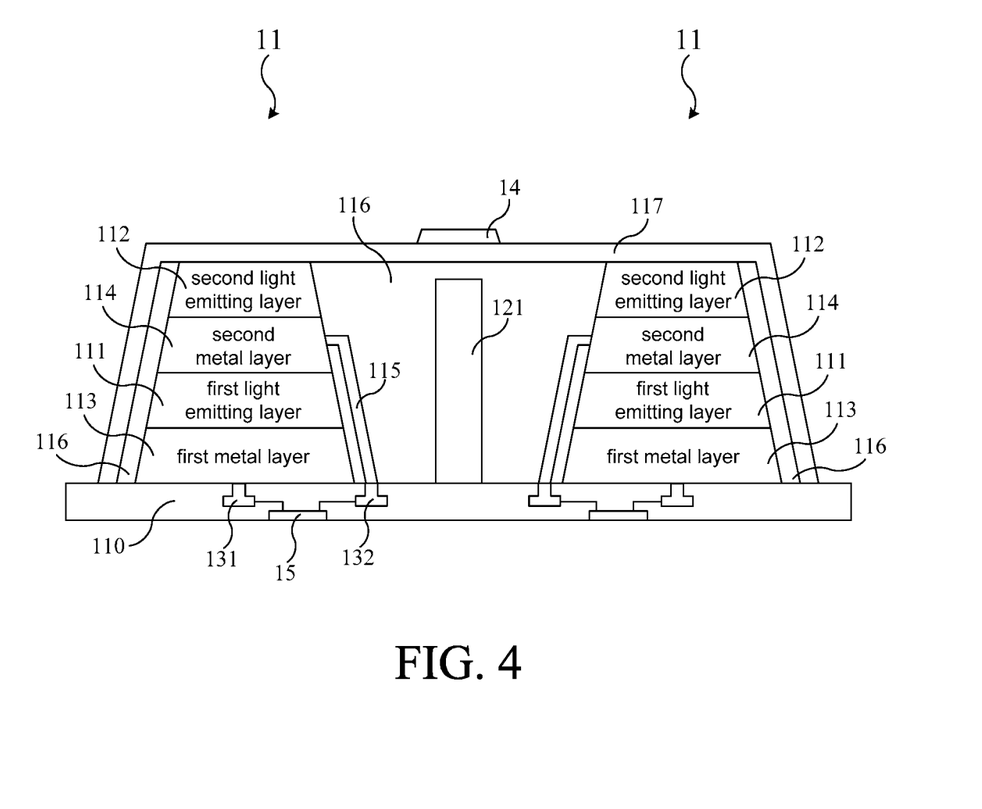
FIG. 4 is a cross-sectional diagram illustrating the two pixels of the double color micro LED display panel according to another embodiment of the present invention.

The configuration of the barrier component 12 can also be other appearances. Please refer to FIG. 4. FIG. 4 is a cross-sectional diagram illustrating the two pixels 11 of the double color micro LED display panel 1 according to another embodiment of the present invention. In this embodiment, the barrier component 12 is configured on the substrate 110, insulation layer 116 covers the barrier component 12, and then the top conductive layer 117 is disposed on the insulation layer 116. In practice, the positions of side of the first light emitting layer 111 and the second light emitting layer 112 also can be corresponding to the barrier component 12, so that the barrier component 12 can block the first light and the second light emitted from the side of the first light emitting layer 111 and the second light emitting layer 112 to another of pixels 11. Moreover, the barrier component 12 is separated from the top conductive layer 117 by the insulation layer 116, so that the insulation layer 116 can prevent the barrier component 12 and the top conductive layer 117 from causing a short circuit.

In this embodiment, the barrier component 12 has an optical isolation structure 121. In practice, the optical isolation structure 121 may include a light absorbing material formed on the surface of the optical isolation structure 121. The light absorbing material can absorb the certain wavelength of light or certain color. For example, the first light is a blue light, and the second light is a green light. The optical isolation structure 121 can absorb the blue light and the green light. In one embodiment, two light absorbing materials are formed on the different positions of the optical isolation structure 121. The blue light absorbing material is formed on the portion of the optical isolation structure 121 corresponding to the first light emitting layer 111 to absorb the first light, and green light absorbing material is formed on the portion of the optical isolation structure 121 corresponding to the second light emitting layer 112 to absorb the second light. Therefore, the barrier component 12 can absorb and baffle the light emitted from the one of the pixels to another of the pixels to reduce the light crosstalk, thereby increasing the display efficiency and the resolution.

Figure 5:
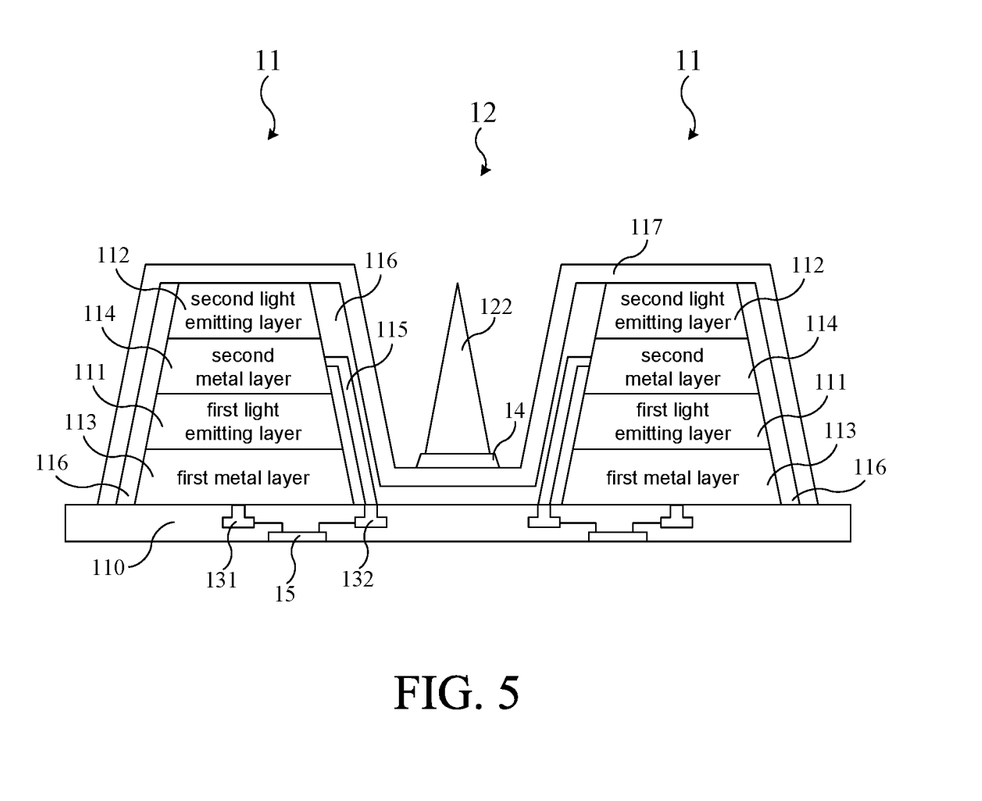
FIG. 5 is a cross-sectional diagram illustrating the two pixels of the double color micro LED display panel according to another embodiment of the present invention.

Please refer to FIG. 5. FIG. 5 is a cross-sectional diagram illustrating the two pixels 11 of the double color micro LED display panel 1 according to another embodiment of the present invention. In this embodiment, the barrier component 12 has a reflective structure 122. In practice, the reflective structure 122 may be a triangular reflective prism. The surface of reflective structure facing to the first light emitting layer 111 and the second light emitting layer 112 can be formed a reflective layer to reflect the first light and the second light. Therefore, the barrier component 12 can reflect the light emitted from the one of the pixels to another of the pixels, thereby increasing the display efficiency. In addition, the reflective structure 122 can reflect the first light and the second light to a certain direction according to the angle of the triangular prism. In practice, the certain direction can be perpendicular and away from the substrate. That is to say, the certain direction is the direction in which the pixel 11 emits light. Therefore, when the first light and the second light are emitted from the side of the first light emitting layer 111 and the second light emitting layer 112, the barrier component 12 can change the direction of the first light and the second light to increase the light output rate, thereby increasing the display efficiency.

Figure 6:
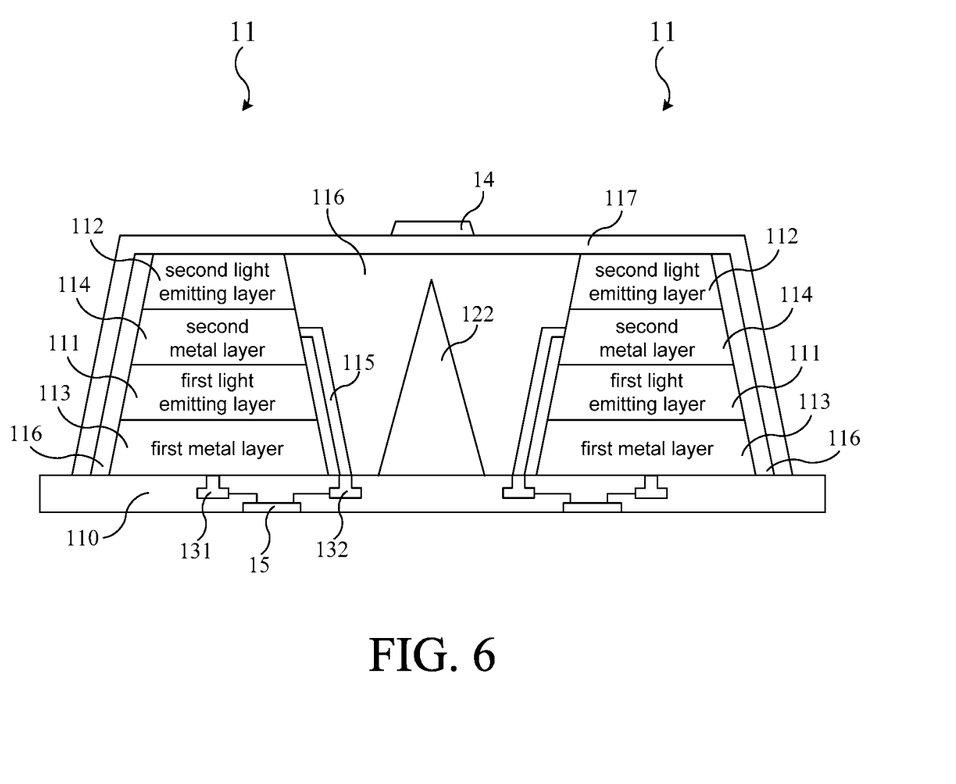
FIG. 6 is a cross-sectional diagram illustrating the two pixels of the double color micro LED display panel according to another embodiment of the present invention.

Please refer to FIG. 6. FIG. 6 is a cross-sectional diagram illustrating the two pixels 11 of the double color micro LED display panel 1 according to another embodiment of the present invention. In this embodiment, barrier component 12 is configured on the substrate 110 directly, the insulation layer 116 covers the barrier component 12, and the top conductive layer 117 is configured on the insulation layer 116. Similarly, when the first light and the second light are emitted from the side of the first light emitting layer 111 and the second light emitting layer 112, the barrier component 12 changes the direction of the first light and the second light to the certain direction, and the first light and the second light pass through the transparent insulation layer 116 and the top conductive layer 117 to emit light.

In one embodiment, the pixel 11 further includes an anode pad 13 and a cathode pad 14. In this embodiment, the anode pad 13 is configured on the substrate 110. The cathode pad 14 is configured on the top conductive layer 117 and located between the pixels 11. Furthermore, the first metal layer 113 and the second metal layer 114 are connected to the anode pad 13 of the substrate 110. In practice, the anode pad 13 can be a P-electrode, and the cathode pad 14 can be an N-electrode. When the circuit applies to the pixel, the first light emitting layer 111 emits first light and the second light emitting layer 112 emits the second light. Moreover, the pixel further includes a conductive layer stacked on the first light emitting layer 111, and an isolation layer stacked on the conductive layer. The conductive layer is electrically connected to the cathode pad 14, and the function of the conductive layer is the same as the top conductive layer 117. The isolation layer is non-conductive layer. Therefore, when the circuit applies to the pixel, the first light emitting layer 111 between the first metal layer 113 and the conductive layer emits the first light, and the second light emitting layer 112 between the second metal layer 114 and the top conductive layer 117 emits the second light.

In one embodiment, the anode pad 14 includes a first anode pad 131 and a second anode pad 132 (as shown in FIG. 2). The first metal layer 113 is connected to the first anode pad 131, and the second metal layer 114 is connected to the second anode pad 132. Furthermore, the pixel 11 includes a connecting structure 115 connected to the second metal layer 114 and the second anode pad 132 of the substrate 110. In practice, the connecting structure 115 can be a metal wire or plate to electrically connect the second metal layer 114 and the second anode pad 132, so that the circuit can be applied from the second anode pad 132 to the second metal layer 114, to make the second light emitting layer 112 emit light.

In this embodiment, the double color micro LED display panel 1 further includes a plurality of pixel drivers 15 respectively configured on the substrate 110 of the pixels 11. Moreover, the pixel driver 15 connects to the first anode pad 131 and the second anode pad 132. In practice, the pixel driver 15 can be a controlling chip. The pixel driver 15 can apply the circuit to the first anode pad 131 and the second anode pad 132 respectively to control the first light emitting layer 111 and the second light emitting layer 112 to emit light.

Figure 7:
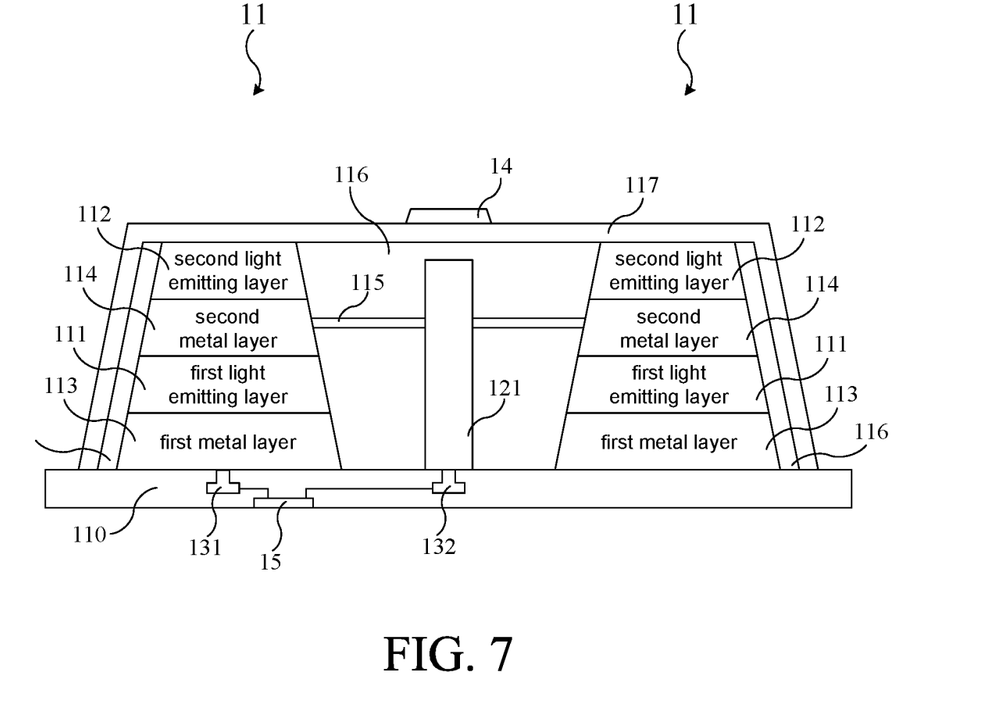
FIG. 7 is a cross-sectional diagram illustrating the two pixels of the double color micro LED display panel according to another embodiment of the present invention.

Please refer to FIG. 7. FIG. 7 is a cross-sectional diagram illustrating the two pixels 11 of the double color micro LED display panel according to another embodiment of the present invention. The difference between this embodiment and aforementioned embodiments is that the connecting structure 115 connects to the optical isolation structure 121, and the optical isolation structure 121 connects to the second anode pad 132 directly. In practice, the material of the optical isolation structure 121 may be a conductive material, and the optical isolation structure 121 includes the light absorbing material formed on the surface of the optical isolation structure 121. Therefore, the anode pad 132 and the second metal layer can be electrically connected through the optical isolation structure 121 and the connecting structure 115. Furthermore, the pixel driver 15 can apply the circuit to the second metal layer 114, to make the second light emitting layer 112 emit light. Similarly, the optical isolation structure 121 can be changed to the reflective structure.

In one embodiment, the pixel further includes a first connecting structure and a second connecting structure. The first connecting structure connects the first metal layer and the barrier component, the second connecting structure connects the second metal layer and the barrier component, and the barrier component connects to the anode pad. In this embodiment, the first metal layer is electrically connected to the cathode pad.

In one embodiment, the first light emitting layer includes a first P type semiconductor layer and a first N type semiconductor layer, and the second light emitting layer includes a second P type semiconductor layer and a second N type semiconductor layer. The first P type semiconductor layer and the second P type semiconductor layer connect to the barrier component, and the barrier component connects to the anode pad. In this embodiment, the first metal layer is electrically connected to the cathode pad and the first N type semiconductor layer, and the second N type semiconductor layer is connected to the isolation layer and electrically connected to the cathode pad configured on the isolation layer.

Figure 8:
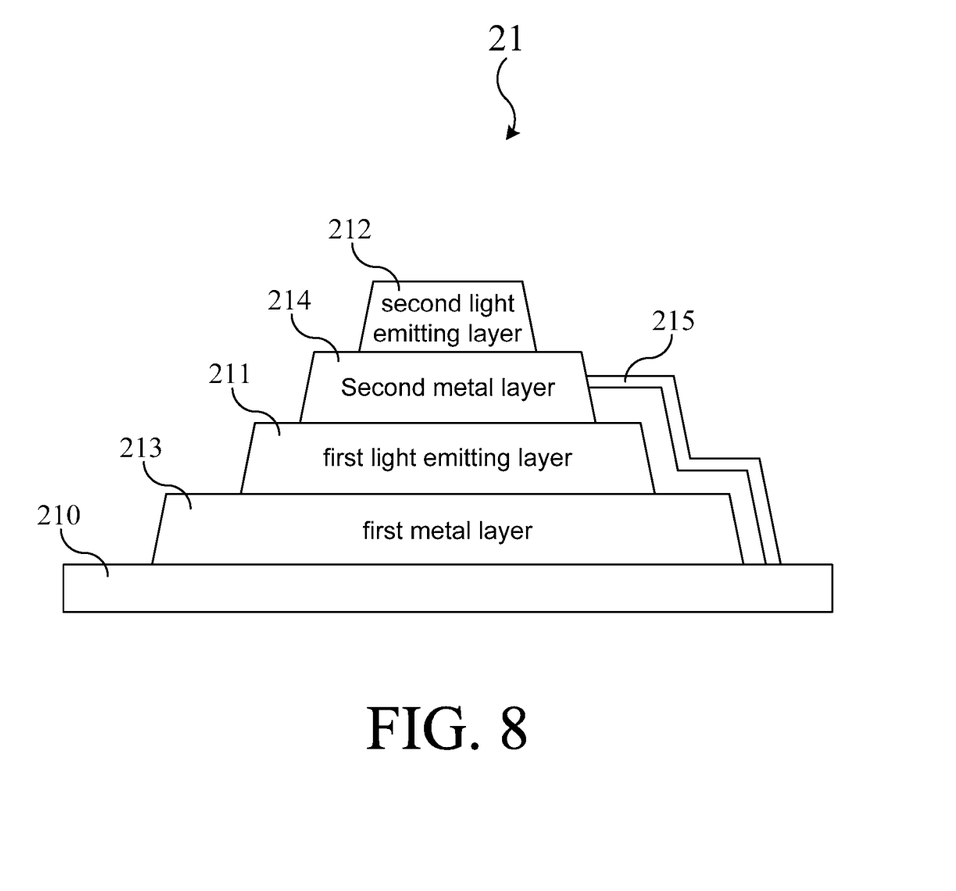
FIG. 8 is a cross-sectional diagram illustrating the pixel of the double color micro LED display panel according to another embodiment of the present invention.

The configuration of each layer of the pixel can also be other appearances. Please refer to FIG. 8. FIG. 8 is a cross-sectional diagram illustrating the pixel 21 of the double color micro LED display panel according to another embodiment of the present invention. In this embodiment, the area of the first metal layer 213 is larger than that of the first light emitting layer 211, the area of the first light emitting layer 211 is larger than that of the second metal layer 214, and the area of the second metal layer 214 is larger than that of the second light emitting layer 212. In practice, the shape of the pixel 21 can be a stair shape. It means that the second metal layer 214 only covers a part of the first light emitting layer 211. Therefore, the other uncovered portion of the first light emitting layer 211 can emit the first light directly, thereby increasing the light output rate. Moreover, the connecting structure 215 also can be a stair shape structure. In practice, when the insulation layer is disposed on the pixel, the shape of the insulation layer may also be the stair shape. Therefore, the connecting structure 215 can be configured along the shape of each layer to prevent from exposing out of the insulation layer and causing the short circuit, thereby increasing the safety.

Figure 9:
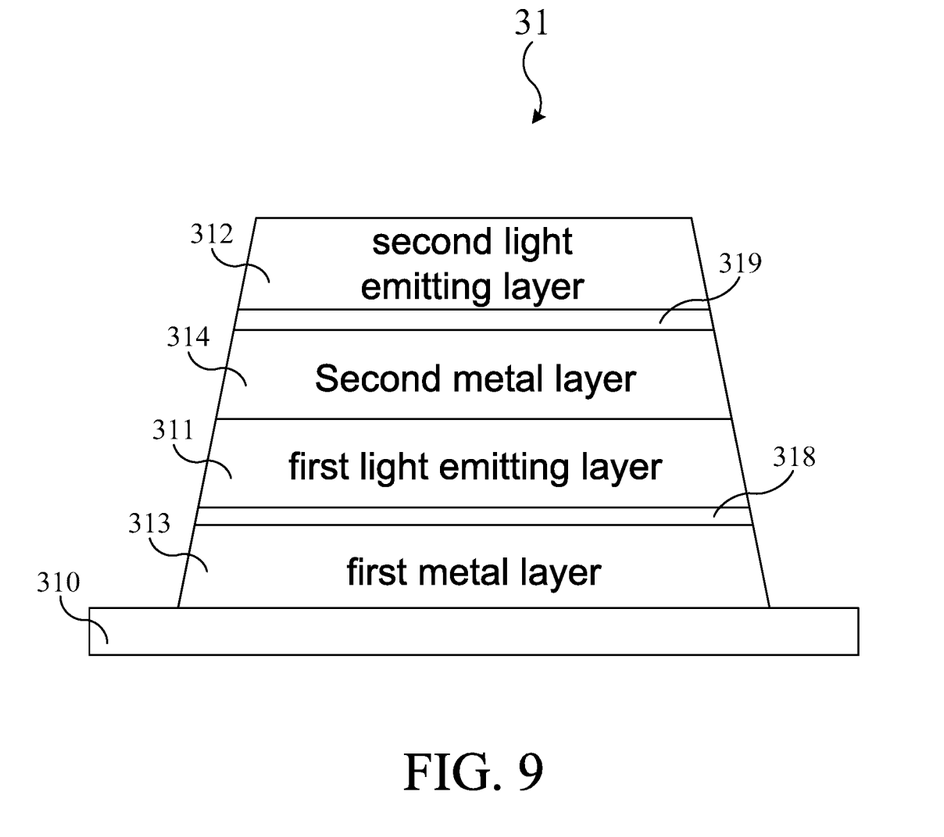
FIG. 9 is a cross-sectional diagram illustrating the pixel of the double color micro LED display panel according to another embodiment of the present invention.

Please refer to FIG. 9. FIG. 9 is a cross-sectional diagram illustrating the pixel 31 of the double color micro LED display panel 3 according to another embodiment of the present invention. In this embodiment, the pixel 31 further includes a first reflective layer 318 and a second reflective layer 319. The first reflective layer 318 is configured between the first metal layer 313 and the first light emitting layer 311. The second reflective layer 319 is configured between the second metal layer 314 and the second light emitting layer 312. In practice, the first reflective layer 318 can be coated on the first metal layer 313 and the second reflective layer 319 can be coated on the second metal layer 314. The materials of the first reflective layer 318 and the second reflective layer 319 can be a conductive material such as Ti3O5. Therefore, the first metal layer 313 can still electrically connects to the first light emitting layer 311 through the first reflective layer 318, and the second metal layer 314 can still electrically connects to the second light emitting layer 312 through the second reflective layer 319. Moreover, the first reflective layer 318 and the second reflective layer 319 can reflect certain wavelength of light to the certain direction respectively. For example, the first reflective layer 318 reflects the blue light, and the second reflective layer 319 reflects the green light. The certain direction is the same as the certain direction mentioned in the previous embodiments, which is not described herein. Therefore, the first reflective layer 318 and the second reflective layer 319 can respectively reflect other directions of the first light and the second light emitted from the first light emitting layer 311 and the second light emitting layer 312 to the certain direction to increase the light output rate, thereby increasing the display efficiency.

In summary, the double color micro LED display panel of the present invention can effectively block the light emitted from one pixel to another of pixels by the barrier component. The barrier component can be a reflective structure to increase the light output rate, which improves the display efficiency. The barrier component also can be an optical isolation structure to increase the resolution. Moreover, the pixel also can increase the light output rate by the reflective layer configured between the metal layer and the light emitting layer.

With the examples and explanations mentioned above, the features and spirits of the invention are hopefully well described. More importantly, the present invention is not limited to the embodiment described herein. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A double color micro LED display panel, comprising:
a plurality of pixels, each of the pixels comprising:
a substrate;
a first metal layer disposed on the substrate;
a first light emitting layer, disposed on the first metal layer and emitting a first light;
a second metal layer disposed on the first light emitting layer; and
a second light emitting layer, disposed on the second metal layer and emitting a second light, the wavelength of the second light being different from that of the first light;
an insulation layer, covering the pixels and exposing a portion of the second light emitting layer of each of the pixels;
a top conductive layer configured on the insulation layer and electrically connected to the exposed portions of the second light emitting layers; and
a plurality of barrier components, respectively located between the pixels for blocking a light emitted from one of the pixels to the other of the pixels.

2. The double color micro LED display panel of claim 1, wherein the insulation layer covers the side wall of the first metal layer, the first light emitting layer, the second metal layer, the second light emitting layer, and the surface of the substrate; the insulation layer extends to the position between the pixels.

3. The double color micro LED display panel of claim 2, wherein the top conductive layer extends to the position between the pixels, and the barrier component is disposed on the top conductive layer.

4. The double color micro LED display panel of claim 3, further comprising a plurality of conductive pads respectively disposed on the top conductive layer and located between the pixels, and the barrier component covering the conductive pad.

5. The double color micro LED display panel of claim 3, wherein each of the pixels comprises an anode pad electrically connected to the first metal layer and the second metal layer, and a cathode pad electrically connected to the top conductive layer.

6. The double color micro LED display panel of claim 2, wherein the insulation layer further covers the barrier component.

7. The double color micro LED display panel of claim 6, wherein the top conductive layer extends to the position between the pixels, and the top conductive layer is separated from the barrier component by the insulation layer.

8. The double color micro LED display panel of claim 7, further comprising a plurality of conductive pads respectively configured on the top conductive layer between the pixels and located above the barrier component.

9. The double color micro LED display panel of claim 1, wherein the barrier component has a reflective structure to reflect the first light emitted from the first light emitting layer to a certain direction.

10. The double color micro LED display panel of claim 1, wherein the barrier component has an optical isolation structure to baffle the first light emitted from the first light emitting layer.

11. The double color micro LED display panel of claim 1, wherein the positions of one side of the first light emitting layer and the second light emitting layer are corresponding to the barrier component, and the barrier component blocks the first light emitted from the first light emitting layer and the second light emitted from the second light emitting layer.

12. The double color micro LED display panel of claim 1, wherein the area of the first light emitting layer is larger than that of the second metal layer, and the area of the second metal layer is larger than that of the second light emitting layer.

13. The double color micro LED display panel of claim 1, wherein the cross-sectional area of the first metal layer, the first light emitting layer, the second metal layer, and the second light emitting layer decreases from the bottom layer to the top layer.

14. The double color micro LED display panel of claim 1, further comprising a plurality of pixel drivers respectively configured on the substrate of the pixels, the first light emitting layer and the second light emitting layer being electrically connected to the pixel driver, and the pixel driver driving the first light emitting layer and the second light emitting layer to emit the first light and the second light respectively.

15. The double color micro LED display panel of claim 1, wherein each of the pixels comprises a conductive pad configured on the substrate, and the first metal layer and the second metal layer are electrically connected with the conductive pad of the substrate.

16. The double color micro LED display panel of claim 15, wherein each of the pixels comprises a connecting structure electrically connecting to the second metal layer and the conductive pad of the substrate.

17. The double color micro LED display panel of claim 16, wherein the shape of the connecting structure is stair shape.

18. The double color micro LED display panel of claim 1, each of the pixels comprises a first reflective layer configured between the first metal layer and the first light emitting layer, and a second reflective layer configured between the second metal layer and the second light emitting layer.

19. The double color micro LED display panel of claim 1, wherein the first light and the second light are selected from two of red, blue, yellow, green, orange, cyan and purple lights.

* * * * *